United States Patent
Du et al.

(10) Patent No.: US 7,176,824 B2
(45) Date of Patent: Feb. 13, 2007

(54) IMPRINT-FREE CODING FOR FERROELECTRIC NONVOLATILE COUNTERS

(75) Inventors: Xiao Hong Du, Colorado Springs, CO (US); Dennis C. Young, Colorado Springs, CO (US)

(73) Assignee: Ramtron International, Colorado Springs, CO (US)

(*) Notice: Subject to any disclaimer, the term of this patent is extended or adjusted under 35 U.S.C. 154(b) by 532 days.

(21) Appl. No.: 10/719,108

(22) Filed: Nov. 21, 2003

(65) Prior Publication Data

US 2005/0111287 A1    May 26, 2005

(51) Int. Cl.
*H03M 1/82* (2006.01)
(52) U.S. Cl. .............. 341/152; 341/50; 341/51
(58) Field of Classification Search ........... 341/50, 341/51, 65, 67, 152
See application file for complete search history.

(56) References Cited

U.S. PATENT DOCUMENTS

| | | |
|---|---|---|
| 3,651,415 A | 3/1972 | Glasson |
| 5,745,403 A | 4/1998 | Taylor |
| 5,777,921 A | 7/1998 | Takata et al. |
| 5,912,846 A | 6/1999 | Taylor |
| 5,978,252 A | 11/1999 | Miwa |
| 5,986,920 A | 11/1999 | Tada |
| 6,246,603 B1 | 6/2001 | Brady |
| 6,580,634 B2 | 6/2003 | Fuchikami et al. |
| 6,590,798 B1 | 7/2003 | Komatsuzaki |
| 6,794,997 B2 * | 9/2004 | Sprouse ................. 341/50 |

FOREIGN PATENT DOCUMENTS

EP    1 087 403 A1    3/2001

OTHER PUBLICATIONS http://en.wikipedia.org/wiki/Manchester_encoding, Wikipedia The Free Encyclopedia, Sep. 6, 2003.
EPO Partial European Search Report; EP 04 25 4400; Oct. 11, 2006.

* cited by examiner

Primary Examiner—Jean Bruner Jeanglaude
(74) Attorney, Agent, or Firm—Hogan & Hartson LLP

(57) ABSTRACT

An encoder utilizes a coding method for use with ferroelectric or other nonvolatile counters which are subject to imprint ensures that all of the bits in the code are frequently switched and not left in a fixed data state. The general coding equation for this method is such that: for an even integer n, it is represented by the conventional binary code of n/2; for an odd integer n, it is represented by the conventional binary code of the one's compliment of (n−1)/2. With this method, every bit switches to its compliment when counting from an even number to an odd number so that imprint is substantially reduced.

18 Claims, 4 Drawing Sheets

5-bit Conventional Binary Coding

```
         MSB       LSB
         0 0 0 0 0
         0 0 0 0 1
         0 0 0 1 0
  10     0 0 0 1 1
         0 0 1 0 0
         0 0 1 0 1
         0 0 1 1 0
         0 0 1 1 1
         0 1 0 0 0
         0 1 0 0 1
         0 1 0 1 0
         0 1 0 1 1
         0 1 1 0 0
         0 1 1 0 1
         0 1 1 1 0
         0 1 1 1 1
         ①  0 0 0 0
```

MSB switches to 1 after 16 zeros written

Table I.  Encoding Table for 4-bit

| Number | Encode |
|---|---|
| 0 | 0000 |
| 1 | 1111 |
| 2 | 0001 |
| 3 | 1110 |
| 4 | 0010 |
| 5 | 1101 |
| 6 | 0011 |
| 7 | 1100 |
| 8 | 0100 |
| 9 | 1011 |
| 10 | 0101 |
| 11 | 1010 |
| 12 | 0110 |
| 13 | 1001 |
| 14 | 0111 |
| 15 | 1000 |

Table II.  Encoding Table for 5-bit

| Number | Encode |
|---|---|
| 0 | 00000 |
| 1 | 11111 |
| 2 | 00001 |
| 3 | 11110 |
| 4 | 00010 |
| 5 | 11101 |
| 6 | 00011 |
| 7 | 11100 |
| 8 | 00100 |
| 9 | 11011 |
| 10 | 00101 |
| 11 | 11010 |
| 12 | 00110 |
| 13 | 11001 |
| 14 | 00111 |
| 15 | 11000 |
| 16 | 01000 |
| 17 | 10111 |
| 18 | 01001 |
| 19 | 10110 |
| 20 | 01010 |
| 21 | 10101 |
| 22 | 01011 |
| 23 | 10100 |
| 24 | 01100 |
| 25 | 10011 |
| 26 | 01101 |
| 27 | 10010 |
| 28 | 01110 |
| 29 | 10001 |
| 30 | 01111 |
| 31 | 10000 |

IMPRINT-FREE CODING FOR FERROELECTRIC NONVOLATILE COUNTERS

FIELD OF THE INVENTION

The present invention relates to coding methods, and more particularly, to a coding method that substantially reduces imprint when used in conjunction with ferroelectric nonvolatile counters.

BACKGROUND OF THE INVENTION

Ferroelectric materials such as lead-zirconate-titanate ("PZT") can be used as the dielectric material in a ferroelectric capacitor that in turn is used as the memory element in a nonvolatile memory cell, latch, or counter. In order to be useful as the memory element in a semiconductor nonvolatile memory, latch, or counter, however, a ferroelectric capacitor must retain data for an extended period of time at a given storage temperature. The ability to retain data, also known as retention performance, is adversely affected by a multi-faceted mechanism known generally by those skilled in the art as "imprint". The term imprint is used because it implies that the history of the data stored in the ferroelectric capacitor affects its present retention performance. Specifically, storage or writing of data of the same binary value for a long period of time at temperature undesirably degrades the ability of the ferroelectric capacitor to retain data of the opposite binary value.

In a ferroelectric nonvolatile counter, the most significant bits stay at a logic zero data state until the count number is large enough to flip the logic state to a logic one data state, if conventional binary coding methods are used. For a counter with a large number of bits, the most significant bits are written (clocked) to the logic zero data state many times before they are eventually written to a logic one data state. For example, in a 40 bit counter, the most significant bit is written to a logic zero data state $2^{39}$ times, which is about $10^{12}$ times, before it is finally written to a logic one data state. Thus, this most significant bit and the associated nonvolatile ferroelectric capacitor is very significantly imprinted to the logic zero data state, and the imprinting will therefore negatively impact its ability to retain the logic one data state.

Turning now to FIG. 1, a prior art conventional five-bit binary coding scheme is shown. Note that while the least-significant bit ("LSB") switches with every advancement of the count, the most-significant bit ("MSB") does not switch until sixteen zero data states have been written to the associated ferroelectric capacitor. Of course, the imprint problem increases for the most-significant bits as the total number of bits in the counter increases.

What is desired, therefore, is a novel coding scheme in which none of the counter bits is repeatedly forced to the same data state, but is frequently switched so that the undesirable performance degradation due to imprint can be minimized.

SUMMARY OF THE INVENTION

According to the present invention, a coding method suitable for use with ferroelectric or other nonvolatile counters subject to imprint ensures that all of the bits in the code are frequently switched and not left in a fixed data state. The general coding equation for this method is such that: for an even integer n, the output code is represented by the conventional binary code of n/2; for an odd integer n, the output code is represented by the conventional binary code of the one's compliment of (n−1)/2. Using the coding method of the present invention, every bit switches to its compliment when counting from an even number to an odd number. Since every bit switches at least once every two counts, imprint is substantially reduced. Unlike conventional binary coding, the maximal number is encoded to 1000, instead of 1111, in a four-bit coding scheme.

In addition to the method of the present invention, a digital encoder is disclosed including a XNOR gate, a "plus one" operation logic block, and a two-to-one multiplexer for converting an inverted input signal into an encoded output signal. The digital encoder also includes "up/down" and most-significant bit inputs.

The foregoing and other features, utilities and advantages of the invention will be apparent from the following more particular description of an embodiment of the invention as illustrated in the accompanying drawings.

BRIEF DESCRIPTION OF THE DRAWINGS

FIG. 3 a logic table of an encoding scheme according to the present invention suitable for use with a five-bit ferroelectric counter in which imprint effects can be minimized.

DETAILED DESCRIPTION

The general equation for the coding method of the present invention is given by equation (1):

$$n \Rightarrow \begin{cases} \text{Conventional Binary Code of } \left(\frac{n}{2}\right) & \text{if if } n \text{ is even} \\ \text{Conventional Binary Code of } \overline{\left(\frac{n-1}{2}\right)} & \text{if if } n \text{ is odd} \end{cases} \quad (1)$$

Figure 1:
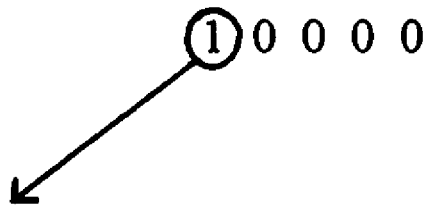
FIG. 1 is a logic table illustrating a five-bit prior art conventional binary coding scheme that can lead to an imprint problem for a nonvolatile ferroelectric counter.
Figure 2:
FIG. 2 a logic table of an encoding scheme according to the present invention suitable for use with a four-bit ferroelectric counter in which imprint effects can be minimized.

For an even integer n, the encoded output is represented by the conventional binary code of n/2; for an odd integer n, the encoded output is represented by the conventional binary code of the one's compliment of (n−1)/2. Applying this method to a four-bit counter, for example, we have the encoding output 20 shown in FIG. 2 (Table I). Every bit switches to its compliment when counting from an even number to an odd number. Thus, imprint is substantially reduced. Note that unlike conventional binary coding, the maximal number is encoded to 1000, instead of 1111, in the case of a four-bit counter. Applying this method to a five-bit counter, for example, we have the encoding output 22 shown in FIG. 3 (Table II). Every bit switches to its compliment when counting from an even number to an odd number. Thus, imprint is substantially reduced. Note that unlike conventional binary coding, the maximal number is encoded to 10000, instead of 11111, in the case of a five-bit counter.

The implementation of the counter with this encoding method is as simple as that with a binary encoding. Tables III and IV show the logic expressions for counting up and counting down for an m-bit counter.

Assume n is expressed by $d_m d_{m-1} d_{m-2} \ldots d_1 d_0$ with this coding method.

Then:

TABLE III

Counting up from $n = d_m d_{m-1} d_{m-2} \ldots d_1 d_0$

| n | n + 1 |
|---|---|
| n is even, i.e. $d_m$ is 0 | $\Rightarrow$    $n + 1 = \bar{d}_m \bar{d}_{m-1} \bar{d}_{m-2} \ldots \bar{d}_1 \bar{d}_0$ |
| n is odd, i.e. $d_m$ is 1 | $\Rightarrow$    $n + 1 = \bar{d}_m \bar{d}_{m-1} \bar{d}_{m-2} \ldots \bar{d}_1 \bar{d}_0 + 1$ |

TABLE IV

Counting down from $n = d_m d_{m-1} d_{m-2} \ldots d_1 d_0$

| n | n − 1 |
|---|---|
| n is even, i.e. $d_m$ is 0 | $\Rightarrow$    $n - 1 = \bar{d}_m \bar{d}_{m-1} \bar{d}_{m-2} \ldots \bar{d}_1 \bar{d}_0 + 1$ |
| n is odd, i.e. $d_m$ is 1 | $\Rightarrow$    $n - 1 = \bar{d}_m \bar{d}_{m-1} \bar{d}_{m-2} \ldots \bar{d}_1 \bar{d}_0$ |

It should be mentioned that with the coding method of the present invention, the output is kept at zero when counting down from zero, instead of rolling over to the maximal number. Similarly, the output is kept at the maximal number when counting up from the maximal number, instead of rolling over to zero. These properties may be desired in some applications.

From Table III and IV, we can see that another advantage of this coding is that only the "+1" operation is needed for both counting up and counting down. An example of a circuit implementation for an m-bit encoder suitable for use in an m-bit ferroelectric counter is shown in FIG. 4 and discussed in further detail below.

Figure 4:
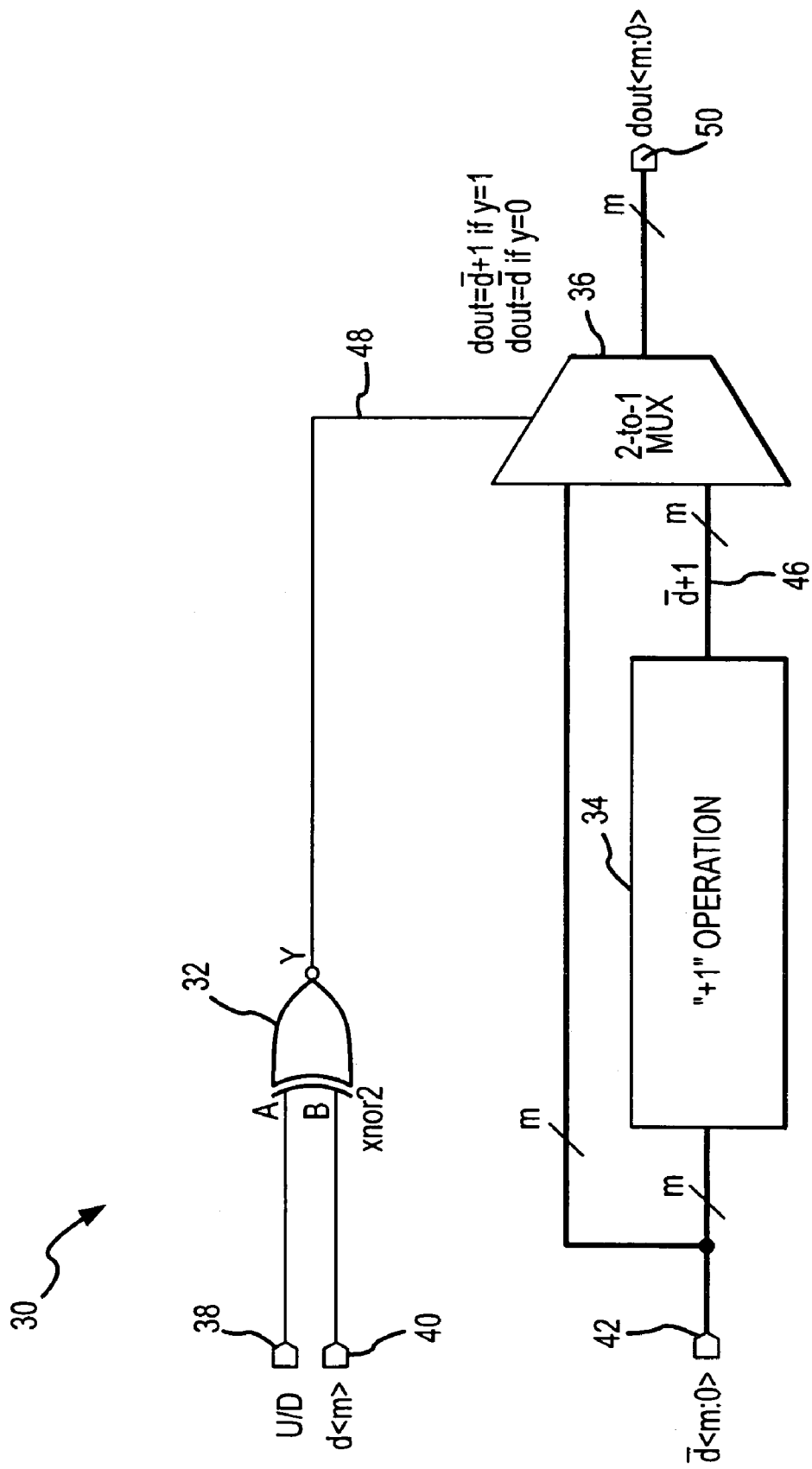
FIG. 4 is a schematic diagram of an encoder according to the present invention including a XNOR gate, a "plus one" operation block, and a two-to-one multiplexer for converting an input signal into an encoded output signal.

Referring now to FIG. 4, a digital logic circuitry implementation of an encoder 30 is shown using the coding method of the present invention. The bold lines in FIG. 4 represents a bus having a width of m bits. Pin U/D on node 38 is set to a logic one for counting up and a logic zero for counting down. The signal on node 40, d<m>, is the most significant bit of the input number. The output dout<m:0> is the result of counting up or counting down from d<m:0>. The signal on node 42, $\bar{d}$<m:0> is an inverted input signal or the one's compliment of d<m:0>.

Encoder 30 includes a "plus-on" operation block 34, which can be implemented using digital combinatorial circuitry as is known by those skilled in the art. The input of block 34 receives the inverted digital input signal $\bar{d}$<m:0>, and the output of block 34 provides the output signal equal to $\bar{d}$<m:0>+1. A first input of the two-to-one multiplexer 36 receives the inverted input signal $\bar{d}$<m:0>, and a second input receives the output signal $\bar{d}$<m:0>+1 on output node 46. A XNOR gate 32 has a first input for receiving an up-down ("U/D") signal on node 38, a second input for receiving a most-significant bit input signal ("d<m>") on node 40, and an output 48 for providing a control signal to multiplexer 36. The output signal dout<m:0> of the encoder 30 is provided at multiplexer output node 50. The output signal is equal to $\bar{d}$ if the control signal on node 48 is a logic zero, and is equal to $\bar{d}$+1 if the control signal on node 48 is a logic one.

If desired, the output signal on node 50 can be input to m ferroelectric latches in parallel in an m-bit counter, corresponding to the width of the m-bit bus. For example a counter having four or five ferroelectric latches corresponding to the coding schemes shown in FIGS. 2 and 3 can be used. The complemented output of the latches can be fed back to node 42 to complete a ferroelectric counter including encoder 30. Other implementations of a full m-bit ferroelectric counter are also possible in which imprint effects can be minimized.

A presently preferred embodiment of the present invention and many of its improvements have been described with a degree of particularity. It should be understood that this description has been made by way of example, and that the invention is defined by the scope of the following claims.

We claim:

1. An encoder for use in a nonvolatile counter comprising:
   a logic gate having a first input for receiving an up/down signal, a second input for receiving a most-significant bit signal, and an output;
   a plus-one block having an input for receiving an inverted input signal and an output; and
   a two-to-one multiplexer having a first input for receiving the inverted input signal, a second input coupled to the output of the plus-one block, a control input coupled to the output of the logic gate, and an output for providing an encoded signal.

2. The encoder of claim 1 in which the first input is set to a logic one for counting up.

3. The encoder of claim 1 in which the first input is set to a logic zero for counting down.

4. The encoder of claim 1 in which the logic gate comprises a XNOR gate.

5. The encoder of claim 1 in which the plus-one block comprises a combinatorial logic circuit.

6. The encoder of claim 1 in which the encoded signal is equal to the inverted input signal if the control signal is a logic zero.

7. The encoder of claim 1 in which the encoded signal is equal to the inverted input signal plus one if the control signal is a logic one.

8. The encoder of claim 1 in which the nonvolatile counter comprises a ferroelectric nonvolatile counter.

9. The encoder of claim 1 in which the nonvolatile counter comprises an m-bit nonvolatile counter.

10. The encoder of claim 9 in which m is equal to 4.

11. The encoder of claim 9 in which m is equal to 5.

12. The encoder of claim 9 in which m is equal to 40.

13. A data encoding method for counting up from input number data $n = d_m d_{m-1} d_{m-2} \ldots d_1 d_0$ comprising:
   adding a logic one to inverted input number data to provide intermediate number data;
   multiplexing the inverted input number data and the intermediate number data to provide output number data; such that:
   if n is even, then the output number data comprises $n+1 = \bar{d}_m \bar{d} d_{m-1} \bar{d}_{m-2} \ldots \bar{d}_1 \bar{d}_0$; and
   if n is odd, then the output number data comprises $n+1 = \bar{d}_m \bar{d}_{m-1} \bar{d}_{m-2} \ldots \bar{d}_1 \bar{d}_0 + 1$.

14. The data encoding method of claim 13 further comprising keeping an output count at a maximal number when counting up from the maximal number instead of rolling the output count over to zero.

15. The data encoding method of claim 14 in which the maximal number is equal to 1000 when m is equal to four.

16. A data encoding method for counting down from input number data $n = d_m d_{m-1} d_{m-2} \ldots d_1 d_0$ comprising:

adding a logic one to inverted in put number data to provide intermediate number data;

multiplexing the inverted input number data and the intermediate number data to provide output number data; such that:

if n is even, then the output number data comprises $n-1 = \bar{d}_m \bar{d}_{m-2} \ldots \bar{d}_1 \bar{d}_0 30\ 1$ ; and if n is odd, then the output number data comprises $n-1 = \bar{d}_m \bar{d}_{m-2} \ldots \bar{d}_1 \bar{d}_0$.

17. The data encoding method of claim 16 further comprising keeping an output count at zero when counting down from zero, instead of rolling the output count over to a maximal number.

18. The data encoding method of claim 16 in which the maximal number is equal to 1000 when m is equal to four.

* * * * *

UNITED STATES PATENT AND TRADEMARK OFFICE
CERTIFICATE OF CORRECTION

PATENT NO. : 7,176,824 B2  
APPLICATION NO. : 10/719108  
DATED : February 13, 2007  
INVENTOR(S) : Xiao Hong Du and Dennis C. Young It is certified that error appears in the above-identified patent and that said Letters Patent is hereby corrected as shown below:

On Title Page

In the Abstract, item 57, lines 8 and 9, "compliment", each occurrence, should read --complement--.

Column 2, lines 2, 4, 52, 55 and 61 and column 3, line 50, "compliment", each occurrence, should read --complement--.

Signed and Sealed this

Tenth Day of April, 2007

JON W. DUDAS  
*Director of the United States Patent and Trademark Office*